(12) United States Patent
Cohen

(10) Patent No.: US 9,210,819 B2
(45) Date of Patent: Dec. 8, 2015

(54) ELECTRONIC DEVICES GRIP PRODUCTS

(71) Applicant: WRAPSOL ACQUISITION, LLC, Fort Collins, CO (US)

(72) Inventor: Lewis S. Cohen, Needham, MA (US)

(73) Assignee: OTTER PRODUCTS, LLC, Fort Collins, CO (US)

( * ) Notice: Subject to any disclaimer, the term of this patent is extended or adjusted under 35 U.S.C. 154(b) by 296 days.

(21) Appl. No.: 13/628,848

(22) Filed: Sep. 27, 2012

(65) Prior Publication Data
US 2013/0081962 A1 Apr. 4, 2013

Related U.S. Application Data

(60) Provisional application No. 61/541,984, filed on Sep. 30, 2011.

(51) Int. Cl.
*B65D 69/00* (2006.01)
*B65D 71/00* (2006.01)
(Continued)

(52) U.S. Cl.
CPC ............. *H05K 5/0204* (2013.01); *B32B 33/00* (2013.01); *B65D 71/00* (2013.01); *B65D 85/00* (2013.01); *F16M 13/00* (2013.01); *G06F 1/16* (2013.01); *G06F 1/1613* (2013.01); *G06F 1/1616* (2013.01); *G06F 1/1626* (2013.01); *G09F 23/00* (2013.01); *H04B 1/3877* (2013.01); *H04B 1/3888* (2013.01); *H04M 1/0202* (2013.01); *H04M 1/0279* (2013.01); *B32B 2307/744* (2013.01); *G06F 2200/1633* (2013.01); *G06F 2200/1634* (2013.01); *H04M 1/04* (2013.01); *H04M 1/18* (2013.01); *Y10T 29/49826* (2015.01); *Y10T 428/24355* (2015.01)

(58) Field of Classification Search
CPC .......... B32B 3/00; B32B 25/04; B32B 25/20; B32B 7/12; B32B 2274/00; H05K 5/0204; B65D 71/00; B65D 85/00; G06F 1/16; G06F 23/00
USPC ............ 206/223, 459.5, 320, 305; 455/575.1; 379/428.01; 428/141, 119, 100
See application file for complete search history.

(56) References Cited

U.S. PATENT DOCUMENTS 5,132,588 A 7/1992 Warman
5,388,691 A 2/1995 White
(Continued)

FOREIGN PATENT DOCUMENTS

CA 2449951 A1 5/2005
CA 2606441 A1 11/2006
(Continued)

OTHER PUBLICATIONS

"Bodyguardz", Product Packaging, 2006, NLU Products, LLC, Draper, Utah.
(Continued)

*Primary Examiner* — Chun Cheung

(57) ABSTRACT

Apparatus are provided that include a grip material and instructions accompanying the grip material. The instructions include at least one of text and a diagram communicating to a purchaser a target electronic device with which the grip material is to be used. The grip material is configured to be attached to a side of the electronic device and occupying a footprint of the side between 5 percent and 100 percent of the surface area of the side of the electronic device.

27 Claims, 11 Drawing Sheets

(51) Int. Cl.
*H05K 5/02* (2006.01)
*B32B 33/00* (2006.01)
*B65D 85/00* (2006.01)
*G06F 1/16* (2006.01)
*G09F 23/00* (2006.01)
*H04M 1/02* (2006.01)
*H04B 1/3888* (2015.01)
*H04B 1/3877* (2015.01)
*F16M 13/00* (2006.01)
*H04M 1/04* (2006.01)
*H04M 1/18* (2006.01)

(56) References Cited

U.S. PATENT DOCUMENTS

| | | | |
|---|---|---|---|
| 5,499,713 A | 3/1996 | Huffer | |
| 5,514,730 A | 5/1996 | Mazurek et al. | |
| 5,965,256 A | 10/1999 | Barrera | |
| 6,017,079 A | 1/2000 | Warner | |
| 6,227,599 B1 | 5/2001 | Campfield et al. | |
| 6,372,323 B1* | 4/2002 | Kobe et al. | 428/119 |
| 6,406,758 B1 | 6/2002 | Bottari et al. | |
| 6,415,138 B2 | 7/2002 | Sirola et al. | |
| 7,054,441 B2 | 5/2006 | Pletikosa | |
| 7,158,376 B2 | 1/2007 | Richardson et al. | |
| 7,180,735 B2 | 2/2007 | Thomas et al. | |
| 7,194,086 B2 | 3/2007 | Pletikosa | |
| 7,214,432 B2 | 5/2007 | Merfeld et al. | |
| 7,290,654 B2 | 11/2007 | Hodges | |
| 7,351,470 B2 | 4/2008 | Draheim et al. | |
| 7,389,869 B2 | 6/2008 | Mason, Jr. | |
| 7,400,917 B2 | 7/2008 | Wood et al. | |
| 7,413,787 B2 | 8/2008 | Vetrovec et al. | |
| 7,529,364 B2 | 5/2009 | Buehler | |
| 7,799,853 B2 | 9/2010 | Ukei et al. | |
| 7,803,292 B2 | 9/2010 | Heki | |
| 7,957,524 B2 | 6/2011 | Chipping | |
| 8,124,216 B2* | 2/2012 | Antonini | 428/172 |
| 8,128,779 B2 | 3/2012 | Ho et al. | |
| 2003/0080947 A1 | 5/2003 | Genest et al. | |
| 2004/0237433 A1 | 12/2004 | Smith | |
| 2004/0246386 A1 | 12/2004 | Thomas et al. | |
| 2005/0007000 A1 | 1/2005 | Chou et al. | |
| 2005/0022924 A1 | 2/2005 | Blackburn | |
| 2005/0047589 A1 | 3/2005 | Chang | |
| 2005/0279661 A1 | 12/2005 | Hodges | |
| 2006/0024263 A1 | 2/2006 | Van Es et al. | |
| 2006/0134406 A1 | 6/2006 | Horigome et al. | |
| 2006/0154029 A1* | 7/2006 | Antonini | 428/141 |
| 2006/0198978 A1* | 9/2006 | Antonini | 428/41.8 |
| 2006/0262405 A1 | 11/2006 | Brumwell | |
| 2006/0285283 A1* | 12/2006 | Simonian et al. | 206/305 |
| 2007/0115387 A1 | 5/2007 | Ho | |
| 2007/0205118 A1* | 9/2007 | Westendorf et al. | 206/229 |
| 2008/0149518 A1* | 6/2008 | Macor | 206/459.5 |
| 2008/0156423 A1 | 7/2008 | Reuter | |
| 2008/0233324 A1 | 9/2008 | Lee et al. | |
| 2009/0134305 A1* | 5/2009 | Tsai et al. | 248/687 |
| 2011/0039099 A1 | 2/2011 | Sherman et al. | |
| 2012/0168056 A1* | 7/2012 | Antonini | 156/67 |

FOREIGN PATENT DOCUMENTS

| | | |
|---|---|---|
| EP | 1018680 A2 | 7/2000 |
| EP | 1939263 A1 | 7/2008 |

OTHER PUBLICATIONS

"Cast vs. Calendered Vinyl"By Judith Evans, Published Oct. 29, 2011 http://www.ehow.com/info__12184086_cast-vs-calendered-vinyl.html(Accessed on Sep. 19, 2012).

"How to put a Screen protector on Apple iPhone or just any phone" (Along with screenshots and transcript thereof) Published on Aug. 26, 2008 <http://www.youtube.com/watch?v=ATvjrxCXt40>.

"InvisibleSHIELD DRY Install Walkthrough—iPhone 4" (Along with screenshots and transcript thereof)Published on Jul. 15, 2010 http://www.youtube.com/watch?v=vXPAuYmkJIU.

"Polyurethane Protective Tape 8663, 8663 DL (dual liner), "Technical Datasheet, Apr. 2010, 3M, St. Paul, Minnesota.

"Polyurethane Protective Tape, Preparation and Application Instructions," Technical Bulletin, Oct. 2001, 3M, St. Paul, Minnesota.

"Polyurethane Protective Tapes to Reduce Aircraft Floor Subsystem Corrosion Damage, "Installation Bulletin, Jul. 2003, 3M, St. Paul, Minnesota.

"Protective Tape Application Solution, "Technical Bulletin, Aug. 2005, 3M, St. Paul, Minnesota.

"Rotor Blade Protection Kit 8999K11, "Application Guide, Jun. 2010, 3M, St. Paul, Minnesota.

"Solution Casting Films; Extrusion Casting Film; Calendering; Casting; Society of Plastics Engineers" Copyright@ 2011 Society of Plastics Engineers (SPE)http://www.4spe.org(Accessed on Sep. 19, 2012).

"Stability in Film Casting", Olena Zavinska, Eindhoven University of Technology Published May 9, 2006 Available at www.win.tue.nl/casa/meetings/casaday/ . . . Film_casting_0905.ppt.

"ZAGG (ZAGG) Introduces Two New Products at CTIA Wireless Show";Published on Mar. 24, 2010 www.streetinsider.com (Article printed on Sep. 10, 2012).

"ZAGG to Introduce invisibleSHIELD Dry (TM) Nationwide Exclusively Through AT&T"; Published on Jun. 28, 2010 www.businesswire.com (Article printed on Sep. 10, 2012).

Declaration of Phillip John Chipping, dated Apr. 27, 2010.

iPodlounge Buyers' Guide 2004, Issue 1, Published Nov. 2004.

NLU Video Tape No. 1 (along with screenshots and transcript thereof) of the Application of NLU BodyGuardz film to ipod published on YouTube on Nov. 20, 2006.

NLU Video Tape No. 2 (along with screenshots and transcript thereof) of the Application of NLU BodyGuardz film to ipod nano published on YouTube on < Sep. 1, 2010.

\* cited by examiner

US 9,210,819 B2

ELECTRONIC DEVICES GRIP PRODUCTS

CROSS-REFERENCE TO RELATED APPLICATIONS

This application claims the benefit of U.S. Provisional Application No. 61/541,984, filed Sep. 30, 2011, the content of which is hereby expressly incorporated by reference herein in its entirety.

FIELD OF THE DISCLOSURE

Aspects of the present disclosure relate to the stabilization, slip prevention, or protection of electronic devices, e.g., using a grip material.

BACKGROUND

Mobile communications devices, including tablet devices, mobile telephones, e-readers, and portable computers, are being used increasingly and by a variety of users in many different locations. These portable devices are subject to damage by a variety of causes, including dropping them during use.

SUMMARY

In accordance with one aspect of the present disclosure, apparatus are provided that include a grip material and instructions accompanying the grip material. The instructions include at least one of text and a diagram communicating to a purchaser a target electronic device with which the grip material is to be used. The grip material is configured to be attached to a side of the electronic device and occupying a footprint of the side between 5 percent and 100 percent of the surface area of the side of the electronic device.

In accordance with another aspect of the present disclosure, apparatus for providing a slip-prevention grip on a portable electronic device are provided that include a carrier carrying kit elements. The kit elements include at least one sheet of grip material with an attachment mechanism and instructions. The one sheet of grip material can have a dimension and configuration to fit on any portable electronic device. The instructions in association with the carrier can state that the grip material is usable with portable electronic devices of varied shapes and sizes. In one embodiment, the instructions can further instruct placing a grip material on a bottom surface of a portable electronic device, using the user interface of the portable electronic device, and concurrent with viewing the display and interacting with the user interface, resting the grip material on the bottom of the electronic device on any surface.

BRIEF DESCRIPTION OF THE DRAWINGS

Embodiments of the disclosure are further described in the detailed description which follows, by reference to the noted drawings, in which like reference numerals represents similar parts throughout the several views of the drawings, and wherein.

DETAILED DESCRIPTION

Figure 1:
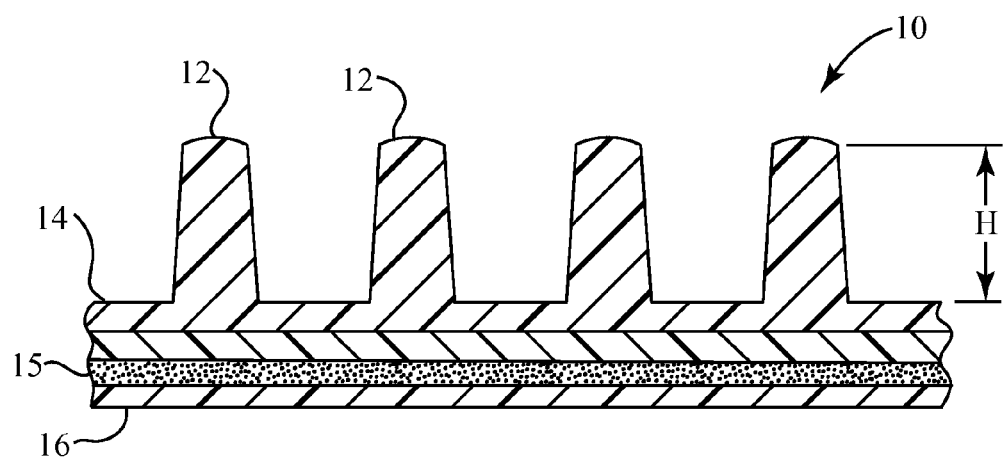
FIG. 1 is a side cross-sectional view of an embodiment of a grip material.

Aspects of the disclosure are directed to a grip material for use with an electronic device, such as an embedded device, or an electronic device component, such as a cover, case, or stand for an electronic device, to prevent the electronic device and/or device component from slipping when positioned on a surface. The grip material can be formed from a variety of materials so long as the material forms a surface that controls friction to allow the grip material to prevent a device from slipping on a surface when the grip material is positioned thereon. In one embodiment shown in FIG. 1, a grip material 10 can be formed from a surface with a microreplicated technology consisting of a plurality of projections 12 extending therefrom to act as a friction control surface to allow the material 10 to grip a surface. The projections 12 extend from the surface of the grip material 10 and provide slip control to a surface to which it is applied. The size and shape of the projections 12 can vary. Generally, the projections 12 with more height H provide a greater grip to prevent slippage of a device to which the grip material is applied. For example, the projections 12 can have a height H of 0.5 mm. In accordance with a specific embodiment of a grip material, a grip material may be used as disclosed in the following patents, the contents of each of which is incorporated by reference in its entirety: U.S. Pat. No. 6,372,323 entitled "Slip Control Article For Wet And Dry Applications," dated Apr. 16, 2002; U.S. Pat. No. 6,610,382 entitled "Friction Control Article For Wet And Dry Applications," dated Aug. 26, 2003; U.S. Pat. No. 7,309,519 entitled "Friction Control Articles For Healthcare Applications," dated Dec. 18, 2007; and U.S. Pat. No. 6,904,615 entitled "Method For Defining A Frictional Interface," dated Jun. 14, 2005. Any terminology in the current specification is meant to be based on what is disclosed herein, and not the terminology in the four patents incorporated herein.

The grip material 10 can have any number of projections 12 extending therefrom, but in an exemplary embodiment the grip material includes 3,000 projections per square inch. In one embodiment, the projections 12 are configured to bend when pressure is applied to the grip material 10, for example, when a device to which the grip material 10 is applied is resting against a surface. The surface area of the projections 12 against the surface increase as the projections 12 bend, which increases the grip that the grip material 10 has on that surface.

The grip material 10 also includes a gripping surface 14 that includes the projections 12 extending therefrom for gripping a surface, and an adhesive surface 16 to allow the grip material 10 to attach to a surface of a device, as will be explained in more detail below. The gripping surface 14 can be formed from a variety of materials, but in one embodiment the gripping surface is formed from a urethane. In one embodiment, the grip material 10 can also include an interface 15 between the gripping surface 14 and the adhesive surface 16. The interface 15 can be formed from a variety of material. For example, the interface 15 can be in the form of a woven backing on the gripping surface 14 or a scrim reinforced backing. The gripping surface 14 can be extruded over the scrim and can either sit on the top of the scrim or encapsulate it.

The weight and hardness of the grip material can also vary. For example, the grip material can also have a variety of durometers. In one embodiment, the grip material has a shore A hardness of 10 to 80. The lower the shore A hardness of the material, the more grip the material has.

The grip material 10 have a variety of sizes and shapes so long as the grip material 10 is sufficient to cover enough of one or more surfaces of an electronic device to prevent the device from slipping when positioned on a surface. For example, the shape of the grip material 10 can include, but is not limited to, a rectangle or an oval. In other embodiments, the grip material 10 can have any shape. The shape of the corners of the grip material 10 can also vary, and can include, for example, square radius corners or other shaped corners, with or without relief cuts. The size of the grip material 10 can also vary. In one embodiment, the grip material 10 can have a size such it is large enough to cover enough of a footprint of one or more surfaces of an electronic device that it is sufficient for preventing slippage of the device and is able to provide a stable platform for the electronic device when the device is positioned on a surface. The size of the grip material 10 can also be maximized to extend to the edges of a surface of the electronic device to which it is applied, or can be less than that maximum size. For example, single or plural sections of grip material 10 can be provided which occupies or collectively occupy a footprint of a surface of a device to which it is applied between 5 percent and 100 percent of the surface area of the surface of the device. In one embodiment, the footprint of the grip material can stop short of the edges of the side of the electronic device by at least 5 percent of the width of the side and 5 percent of the length of the side. The grip material 10 can be sized to cover part or all of a single surface of a device, or can be sized to extend beyond a surface of the device and warp around additional surfaces. For example, the grip material 10 can be sized to extend beyond a surface and wrap around sides surfaces of the device. In addition, any number of grip materials can be applied to an electronic device. For example, a single grip material can be applied, or more than one grip material can be applied to a surface of an electronic device.

It is also possible to use multiple grip materials in conjunction with one another to provide additional slip prevention. For example, a first grip material can be applied to an electronic device, and a second grip material can be applied to a surface on which the electronic device can rest such that the first and second grip materials can be used together such that the gripping surfaces of the grip materials can be removably coupled to one another. Specifically, the adhesive surface of the first grip material is applied to an electronic device and the adhesive surface of the second grip material is applied to a surface on which the electronic device can be positioned. The gripping surfaces of the first and second grip materials can be removably coupled to one another to provide additional slip prevention. There can also be a combination of different durometer grip materials attached to a device. In addition, there can also be a combination of different grip materials, i.e., grip materials formed from different types of materials, with the different grip materials having different durometers.

The grip material 10 can be attached to a surface of an electronic device using various techniques. As explained above, the grip material 10 includes an adhesive surface 16 to adhere the grip material 10 to a surface, for example, a surface of an electronic device. In one embodiment, the adhesive surface 16 is a pressure sensitive adhesive surface. The adhesive surface 16 can adhere the grip material 10 to a surface permanently, or removably adhere the grip material 10 to a surface. A variety of materials can be used to provide adhesion, including any type of bonding material such a glue or a pressure sensitive adhesive. The adhesive surface 16 can include a substrate to which an adhesive can be applied. The adhesive surface 16 can also have other features that allow the grip material 10 to attach to a device by other means, for example, with velcro hooked loops, buckles, clips, straps, or by sewing the grip material 10 to a surface.

The grip material can also be attached to the electronic devices or other components associate with electronic devices, such as covers and cases, at various locations on the device. Not only can the grip material be applied to any surface of the electronic device, the grip material can be applied at various locations on that surface depending on how each individual user interacts with and uses the electronic device. For example, if a user of an electronic device put pressure on a particular corner or section of the device during use, the grip material can be applied in that area of the device to provide increased slip prevention. The grip material can also be applied to a portion or all of a single surface of a device, or can extend beyond a surface and wrap around the device to cover a portion or all of additional surfaces of the device. In addition, the grip material can be applied to a surface of a device or device component such that the grip material is raised off the surface of the device or device component, or the device or device component can include one or more recessed formed therein for receiving one or more grip materials. When the grip material is adhered to a device or device component and is seated within a recess, the grip material can be substantially flush with the surface of the device or device component so long as enough of the height of the projections of the grip material extend beyond the surface of the device or device component to allow the projections of the grip material to contact a surface on which the device or device component is placed to allow the grip material to grip the surface. To attach the grip material inside the recess, various material and/or techniques can be used, including the use of a glue, a pressure sensitive adhesive, or the grip material may be adhered during the molding process of the device or device component. If the grip material is adhered during the molding process, in one embodiment the grip material can be formed from a polymer than can withstand high temperatures, such as a urethane polymer that can withstand 500+F.

Figure 2A:
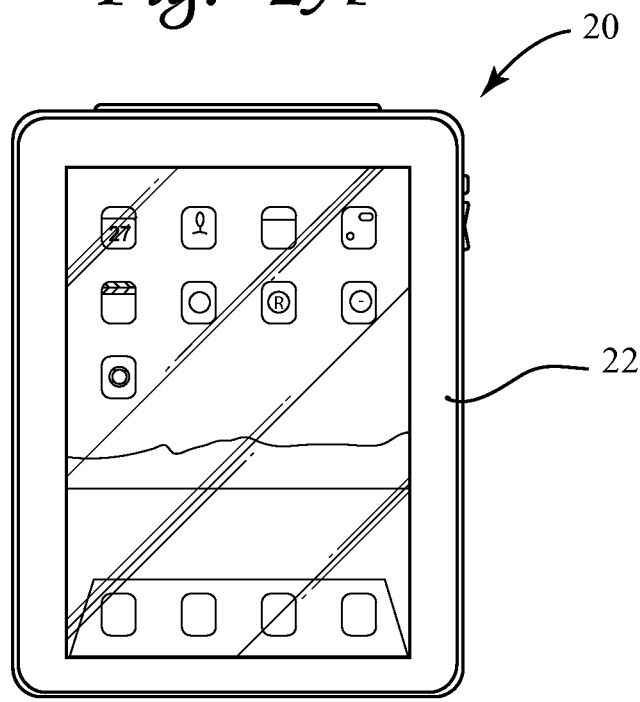
FIG. 2A is a front view of a tablet device for portable computing.
Figure 2B:
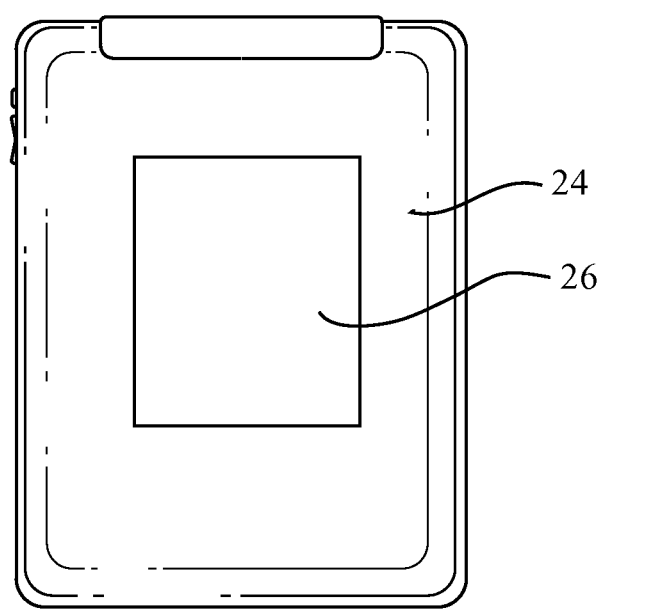
FIG. 2B is a back view of the tablet device of FIG. 2A with a grip material attached thereto.
Figure 2C:
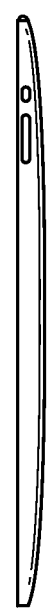
FIG. 2C is a side view of the tablet device of FIG. 2A.

Various types of electronic device can be used with the grip material, and the grip material can be attached to various surfaces of an electronic device depending on the surface of the electronic device that would be positioned on a surface. In one embodiment, the electronic device is a portable computing device, such as a tablet device 20 as shown in FIGS. 2A-2C. The tablet device 20 include a front surface 22 that has a display, a back surface 24, and multiple side surfaces. A grip material can be attached to any surface of the tablet device 20, but in one embodiment as shown in FIG. 2B, a grip material 26 is attached to the back surface 24 of the tablet device 20 in order to prevent the tablet device 20 from slipping along a surface, for example, when a user is using the front surface 22 of the tablet device 20. The grip material 26 is attached to the back surface of the tablet device 20 such that, when the tablet device 20 is resting against a surface and a user is using the screen on the front surface 22 thereof, the tablet device 20 will remain in place due to the friction force between the grip material 26 and the surface on which the tablet device 20 is resting. As explained above, the size of the grip material 26 should be large enough such that the grip material 26 provides a stable surface on which the tablet device 20 rests during use.

Figure 3:
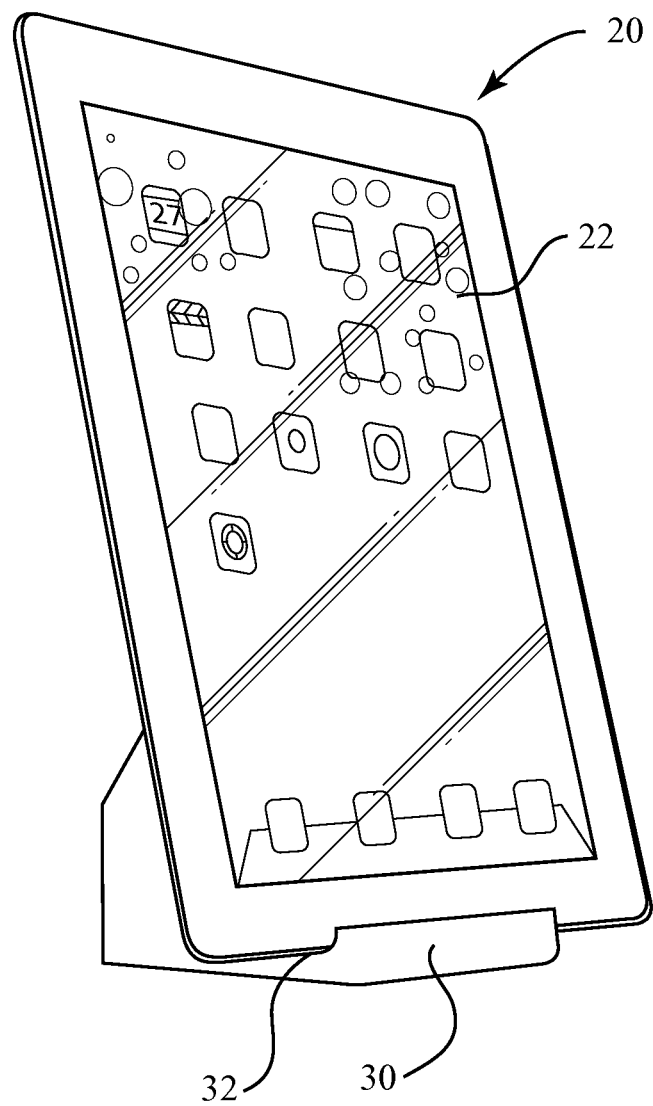
FIG. 3 is a front perspective view of a tablet device and a stand for the tablet device.

In another embodiment, the grip material can be applied to a side of the tablet device 20. This can be useful when the tablet device is used with a dock or a stand 30 that holds the tablet device 20 in an elevated position, as shown in FIG. 3. The grip material can be applied to a side of the tablet device 20 to provide friction with a recess 32 formed in the stand 30 to prevent the tablet device 20 from slipping in the stand 30. It is also possible that the stand 30 can include a grip material adhered inside the recess 32 such that the gripping surface of the grip material on the tablet device 20 can removably couple to the gripping surface of the grip material on the stand 30 to provide additional slip prevention between the tablet device 20 and the stand 30. The size of the grip material attached to the side of the tablet device 20 and/or the recess 32 of the stand 30 can be any size as long as it is large enough to provide enough grip to prevent the tablet device 20 from slipping when placed in the stand 30.

Figure 4:
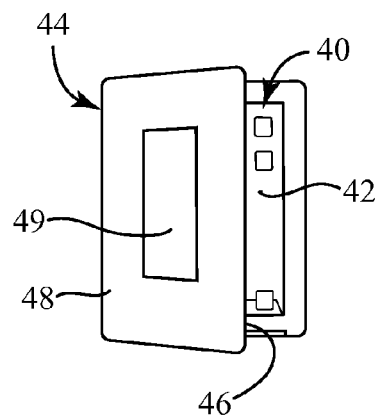
FIG. 4 is a front perspective view of a tablet device inside an embodiment of a cover.

Grip material can also be applied to various types of covers and cases for electronic devices. For example, a grip material can be applied to a cover for a tablet device such that, when the cover is attached to the tablet device, the grip material is positioned in such a location on the cover than the grip material on the cover can prevent the combination of the cover and the tablet device from slipping when placed on a surface. There are various types of covers and cases that can be used with tablet devices. In one embodiment shown in FIG. 4, a cover 44 is attached to a tablet device 40 that covers a front surface 42 of the tablet device 40, for example, to protect the display of the tablet device 40. The cover 44 includes a first surface 46 and a second surface 48. When the cover 44 is closed and protecting the front surface 42 of the tablet device 40 when the tablet device 40 is not in use, the first surface 46 of the cover 44 contacts the front surface 42 of the tablet device 40. When the cover 44 is open to expose the front surface 42 of the tablet device 40 when the tablet device 40 is in use, the first surface 46 is able to rest against a surface to support the tablet device 40 and the second surface 48 contacts the back surface of the tablet device 40. A grip material (not shown) can be applied to the first surface 46 of the cover 44 such that the grip material can prevent the device from slipping when the cover 44 is open and the tablet device 40 is in use. The grip material may be removable from the cover 44 such that the grip material can be removed before the cover 44 is closed and the first surface 46 contacts the front surface 42 of the tablet device 40. A grip material 49 can also be applied to the second surface 48 of the cover 44 to allow the grip material to assist in keep the cover 44 in place when opened. Specifically, when the cover 44 is open, the grip material 49 on the second surface 48 of the cover 44 will contact the back surface of the tablet device 40, keeping the cover 44 from slipping relative to the tablet device 40 itself.

Figure 5A:
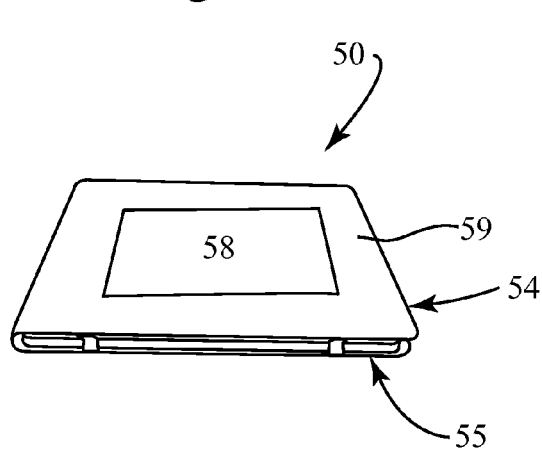
FIG. 5A is a front perspective view of another embodiment of a cover for a tablet device.
Figure 5B:
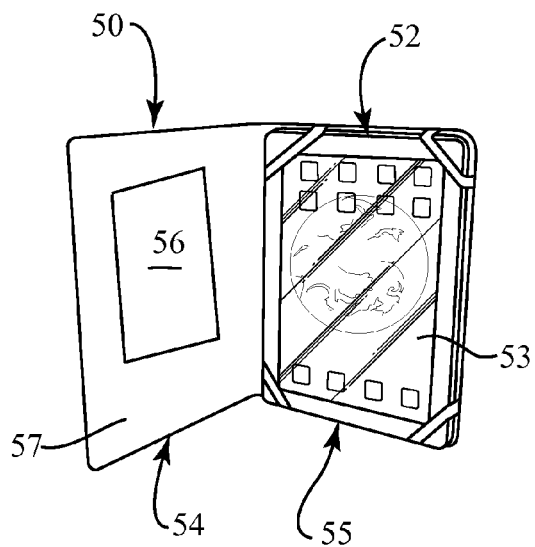
FIG. 5B is a front perspective view of the cover of FIG. 5A shown in an open position.

In another embodiment shown in FIGS. 5A-5B, a cover is attached to a tablet device that covers front and back surfaces of the tablet device. The cover 50 includes a front flap 54 that protects the front surface 53 of a tablet device 52, and a back flap 55 in which the tablet device 52 sits. The cover 50 has a closed position in which the front flap 54 protects the front surface 53 of the tablet device 52, and an open position in which the front flap 54 exposes the front surface 53 of the tablet device 52 and is either merely flipped over or folded back over the tablet device 52 such that the front flap 54 contacts the back flap 55 of the cover 50. A grip material 56 can be applied to a first surface 57 of the front flap 54 such that the grip material 56 can prevent the combination of the cover 50 and the tablet device 52 from slipping when the front flap 54 is open and folded over the tablet device 52. The grip material 56 may be removable from the first surface 57 of the front flap 54 such that the grip material 56 can be removed when the front flap 54 is closed and the first surface 57 contacts the front surface 53 of the tablet device 52. A grip material 58 can also be applied to a second surface 59 of the front flap 54 to allow the grip material 58 to assist in keeping the front flap 54 in place when opened and flipped over the tablet device 52. Specifically, when the front flap 54 is open, the grip material 58 on the second surface 59 of the front flap 54 will contact the back flap 55 of the cover 50, keeping the front flap 54 of the cover 50 from slipping relative to the back flap 55 of the cover 50. A grip material (not shown) can also be applied to the back flap 55 of the cover 50 to prevent the combination of the cover 50 and the tablet device 52 from slipping when the front flap 54 is open but not folded over the tablet device 52. As explained above, the size of the various grip materials should be large enough such that the grip material provides a stable surface on which the cover 50 and the tablet device 52 can rest.

Figure 6A:
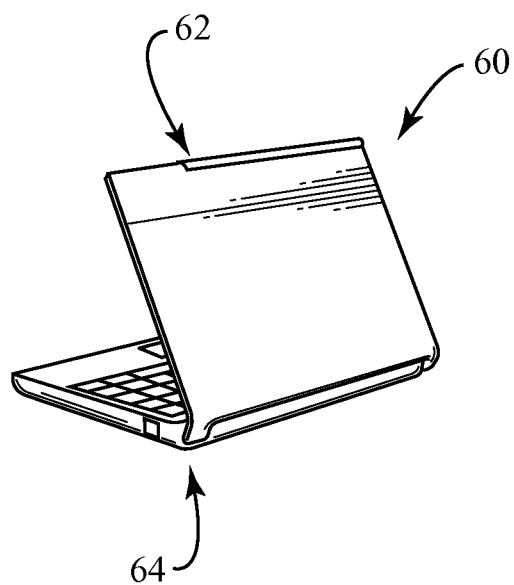
FIG. 6A is a back perspective view of a laptop computer.
Figure 6B:
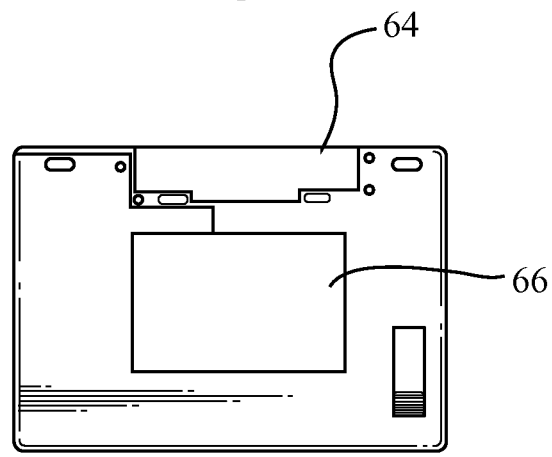
FIG. 6B is a bottom view of the laptop computer of FIG. 6A.

Grip material can also be used with portable computing device, such as a portable computer 60 having top and bottom surfaces 62, 64 as shown in FIGS. 6A-6B. The grip material can be attached to any surface of the portable computer 60, but in one embodiment as shown in FIG. 6B, a grip material 66 is attached to a bottom surface 64 of the portable computer 60 in order to prevent the portable computer 60 from slipping along a surface, for example, when portable computer 60 is positioned on a surface while a user is using the keyboard and viewing the display of the portable computer 60. The grip material 66 is attached to the bottom surface 64 of the portable computer 60 such that, when the portable computer 60 is positioned on a surface and a user is using the screen and/or keyboard, the portable computer 60 will remain in place due to the friction force between the grip material 66 and the surface on which the portable computer 60 is resting. As explained above, the size of the grip material should be large enough to provide enough grip and such that the grip material provides a stable surface on which the portable computer 60 can rest.

Figure 7A:
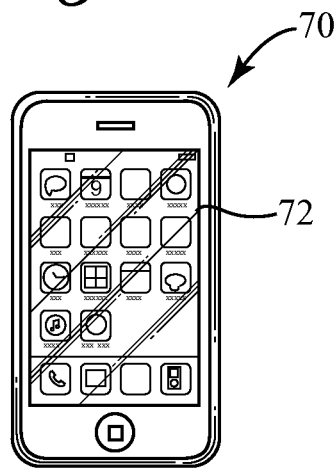
FIG. 7A is a front view of a portable telephone.
Figure 7B:
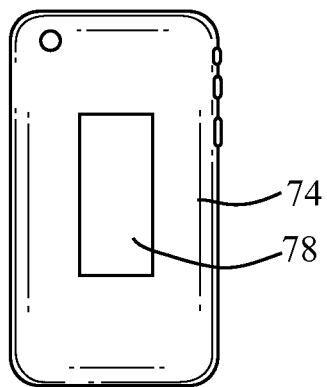
FIG. 7B is a back view of the portable telephone of FIG. 7A with a grip material attached thereto.
Figure 7C:
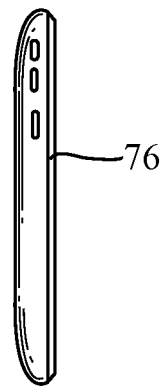
FIG. 7C is a side view of the portable telephone of FIG. 7A.

Grip material can also be used with portable telecommunication devices, such as a portable wireless telephone 70, as shown in FIGS. 7A-7C. The portable telephone 70 includes a front surface 72 having a display and interface for interaction with the user, a back surface 74, and multiple side surfaces 76. A grip material can be attached to any surface of the portable telephone 70, but in one embodiment as shown in FIG. 7B, a grip material 78 is attached to the back surface 74 of the portable telephone 70 in order to prevent the portable telephone 70 from slipping along a surface, for example, when a user is using the front surface 72 of the portable telephone 70. The grip material 78 is attached to the back surface 74 of the portable telephone 70 such that, when the portable telephone 70 is resting against a surface and a user is using the display and/or interface on the front surface 72 thereof, the portable telephone 70 will remain in place due to the friction force between the grip material 78 and the surface on which the portable telephone 70 is resting. As explained above, the size of the grip material 78 should be large enough such that the grip material 78 provides a stable surface on which the portable telephone 70 can rest.

Figure 8A:
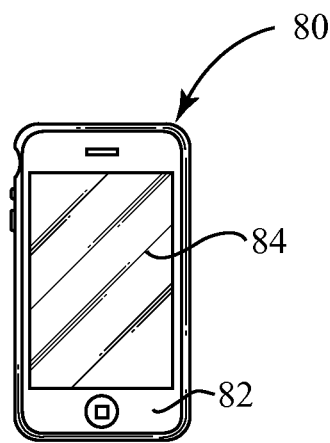
FIG. 8A is a front view of a portable telephone with an embodiment of a case attached thereto.
Figure 8B:
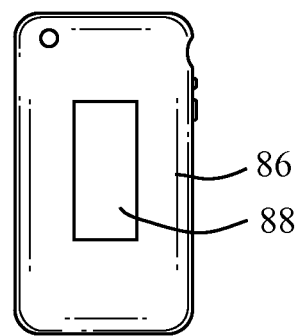
FIG. 8B is a back view of the portable telephone of FIG. 8A with a grip material attached to the case.

Grip material can also be applied to various types of covers and cases for portable telephone devices. The grip material can be applied to a cover for an portable telephone such that, when the cover is attached to the portable telephone, the grip material is positioned in such a location on the cover than the grip material on the cover can prevent the combination of the cover and the portable telephone from slipping when placed on a surface. There are various types of covers and cases that can be used with portable telephones. In one embodiment shown in FIGS. 8A-8B, a cover 80 is shown for a portable telephone 82 that protects the sides and back surface 86 of the portable telephone 82 while leaving a front surface 84 of the portable telephone 82 exposed to allow a user to interact with the display and interface on the front surface 84. A grip material 88 is attached to a back surface of the cover 80 in order to prevent the portable telephone 82 from slipping along a surface, for example, when portable telephone 82 is positioned on a surface while a user is using the display and/or interface on the front surface 84 of the portable telephone 82.

Figure 9:
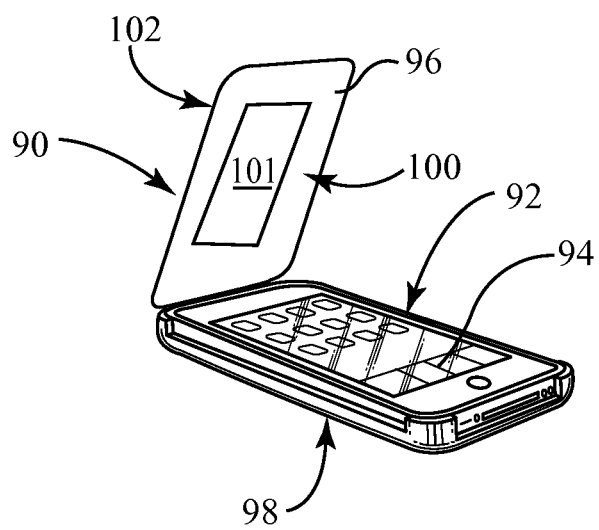
FIG. 9 is a front perspective view of a portable telephone with another embodiment of a case attached thereto.

In another embodiment shown in FIG. 9, a cover 90 is shown for a portable telephone 92 that protects front and back surfaces 94, 96 of the portable telephone 92. The cover 90 has a closed position in which a front flap of the cover 90 protects the front surface of the portable telephone 92, and an open position in which the front flap of the cover 90 exposes the front surface of the portable telephone and is either merely flipped up or folded back over the portable telephone such that the flap contacts a back surface of the cover 90. A grip material 101 can be applied to a first surface 100 of the flap 96 such that the grip material 101 can prevent the device from slipping when the flap is open and folded over the portable telephone 92. The grip material 101 may be removable from the first surface 100 of the flap 96 such that the grip material 101 can be removed before the first surface 100 of the flap 96 when the flap 96 is closed and the first surface 100 contacts the front surface 94 of the portable telephone 92. A grip material (not shown) can also be applied to the second surface 102 of the flap 96 to allow the grip material to assist in keeping the flap 96 in place when opened and flipped over the portable telephone 92. Specifically, when the flap 96 is open, the grip material on the second surface 102 of the flap 96 will contact the back surface 98 of the cover 90, keeping the flap 96 of the cover 90 from slipping relative to the back surface 98 of the cover 90. A grip material can also be applied to the back surface 98 of the cover 90 to prevent the portable telephone 92 from slipping when the flap is open and not folded over the portable telephone 92. As explained above, the size of the grip material should be large enough such that the grip material provides a stable surface on which the portable telephone 92 can rest.

Figure 10A:
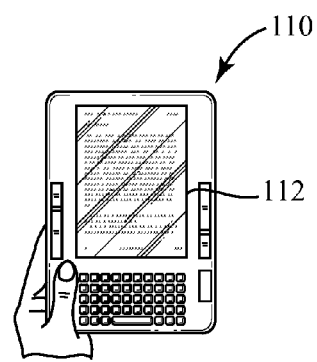
FIG. 10A is a front view of an e-reader device.
Figure 10B:
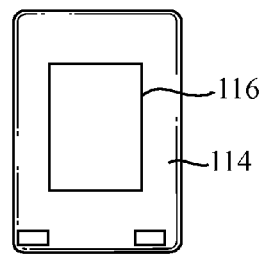
FIG. 10B is a back view of the e-reader device of FIG. 10A with a grip material attached thereto.

Grip material can also be used with e-reader devices, such as an e-reader 110, as shown in FIGS. 10A-10B. The e-reader 110 includes a front surface 112 that has a display for displaying the text of a book and an interface to allow the user to interact with the e-reader, a back surface 114, and multiple side surfaces. A grip material can be attached to any surface of the e-reader 110, but in one embodiment as shown in FIG. 10B, a grip material 116 is attached to the back surface 114 of the e-reader 110 in order to prevent the e-reader 110 from slipping along a surface, for example, when a user is using the front surface 112 of the e-reader 110. The grip material 116 is attached to the back surface 114 of the e-reader 110 such that, when the e-reader 110 is resting against a surface and a user is using the display and/or interface on the front surface 112 thereof, the e-reader 110 will remain in place due to the friction force between the grip material 116 and the surface on which the e-reader 110 is resting. As explained above, the size of the grip material 116 should be large enough such that the grip material 116 provides a stable surface on which the e-reader 110 rests during use.

Figure 11A:
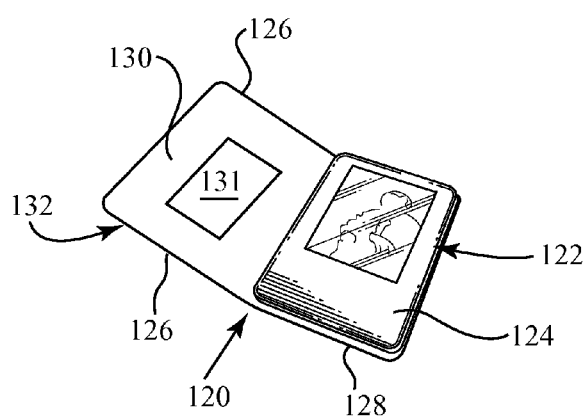
FIG. 11A is a front open view of a case having an e-reader device attached thereto.
Figure 11B:
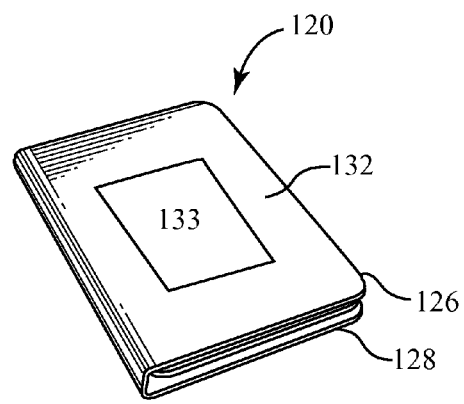
FIG. 11B is a front perspective view of the case of FIG. 11B.

The various covers and cases used with e-readers can also be used with grip material such that, when the cover is attached to the e-readers, the grip material is positioned in such a location on the cover than the grip material on the cover can prevent the combination of the cover and the e-readers from slipping when placed on a surface. In one embodiment shown in FIG. 11A-11B, a cover 120 is attached to an e-reader that covers a front surface and a back surface of the e-reader, for example, to protect the display of the e-reader. The cover 120 includes a front flap 126 that protects the front surface of the e-reader 122, and a back flap 128 in which the e-reader 122 sits. The cover 120 has a closed position in which a front flap 126 of the cover 120 protects the front surface 124 of e-reader 122, and an open position in which the front flap 126 of the cover 120 exposes the front surface 124 of the e-reader 122 and is either merely flipped over or folded back over the e-reader 122 such that the front flap 126 contacts a back flap 128 of the cover 120. A grip material 131 can be applied to a first surface 130 of the front flap 126 such that the grip material 131 can prevent the combination of the cover 120 and the e-reader 122 from slipping when the front flap 126 is open and folded over the e-reader 122. The grip material 131 may be removable from the first surface 130 of the front flap 126 such that the grip material 131 can be removed before the first surface 130 of the front flap 126 when the front flap 126 is closed and the first surface 130 contacts the front surface 124 of the e-reader 122. A grip material 133 can also be applied to a second surface 132 of the front flap 126 to allow the grip material 133 to assist in keeping the front flap 126 in place when opened and flipped over the e-reader 122. Specifically, when the front flap 126 is open, the grip material 133 on the second surface 132 of the front flap 126 will contact the back flap 128 of the cover 120, keeping the front flap 126 of the cover 120 from slipping relative to the back flap 128 of the cover 120. A grip material (not shown) can also be applied to the back flap 128 of the cover 120 to prevent the combination of the cover 120 and the e-reader 122 from slipping when the front flap 126 is open but not folded over the e-reader 122. As explained above, the size of the grip material should be large enough such that the grip material provides a stable surface on which the cover 120 and the e-reader 122 can rest.

Grip material can also be applied to gaming devices, such as portable game systems. Similar to the devices described above, a grip material can be attached to any surface of a gaming device, but in one embodiment, a grip material is attached to a back surface of a gaming device in order to prevent the gaming device from slipping along a surface, for example, when a user is using a display or other interface on a front surface of the gaming device. The grip material can also be applied to any cover, case, stand, or other component that can be used with the gaming device, similar to the covers, cases, and stands described above with regard to other electronic devices.

It will be appreciated that grip material as described above can be used with any type of electronic device (or electronic device component such as a cover, case, or stand) to prevent the electronic device from slipping when placed on a surface, including a tabletop or when resting against the legs of a user. The size and shape of the grip material can vary depending on the size and shape of the device to which the grip material is to be applied. The location of the grip material on the surface of the electronic device can vary depending on where a user places the grip material based on how each individual user positions the electronic device during use.

Figure 12:
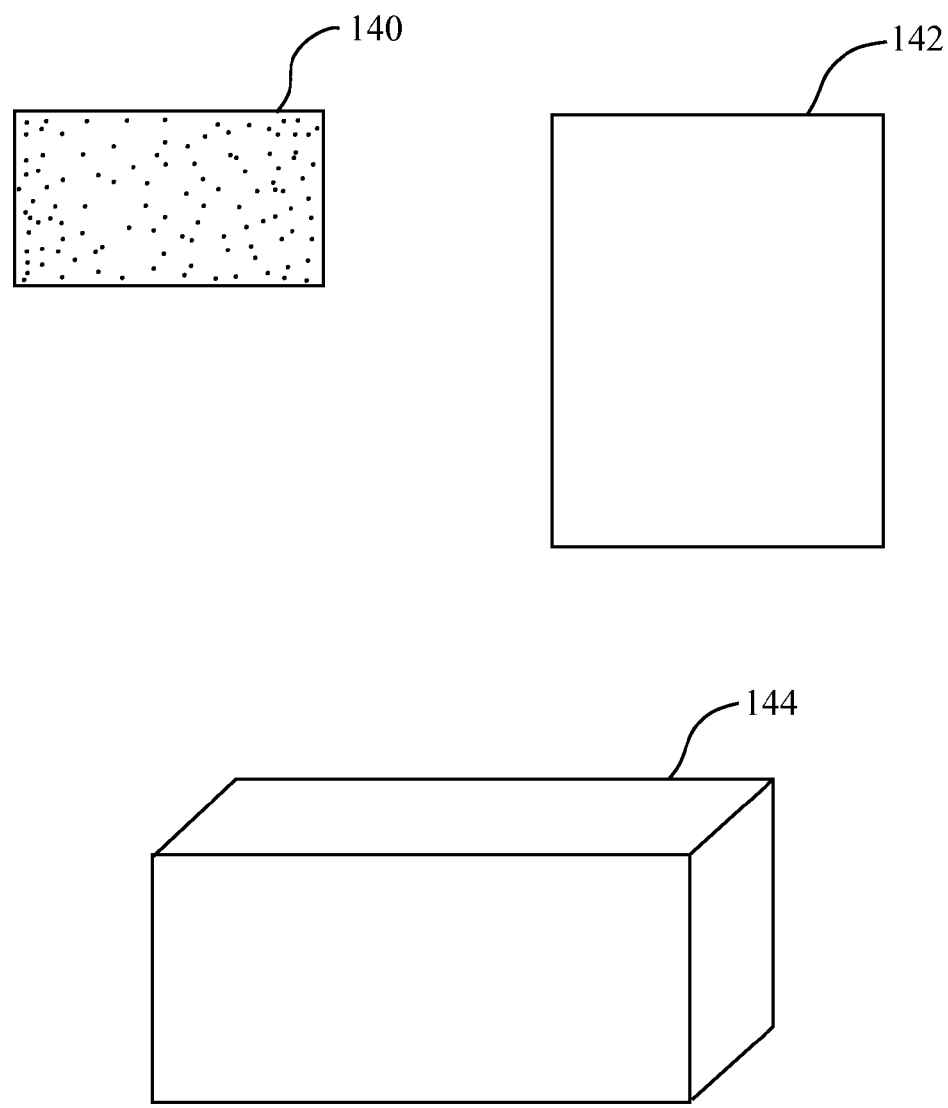
FIG. 12 is a view of kit including a grip material.
Figure 13:
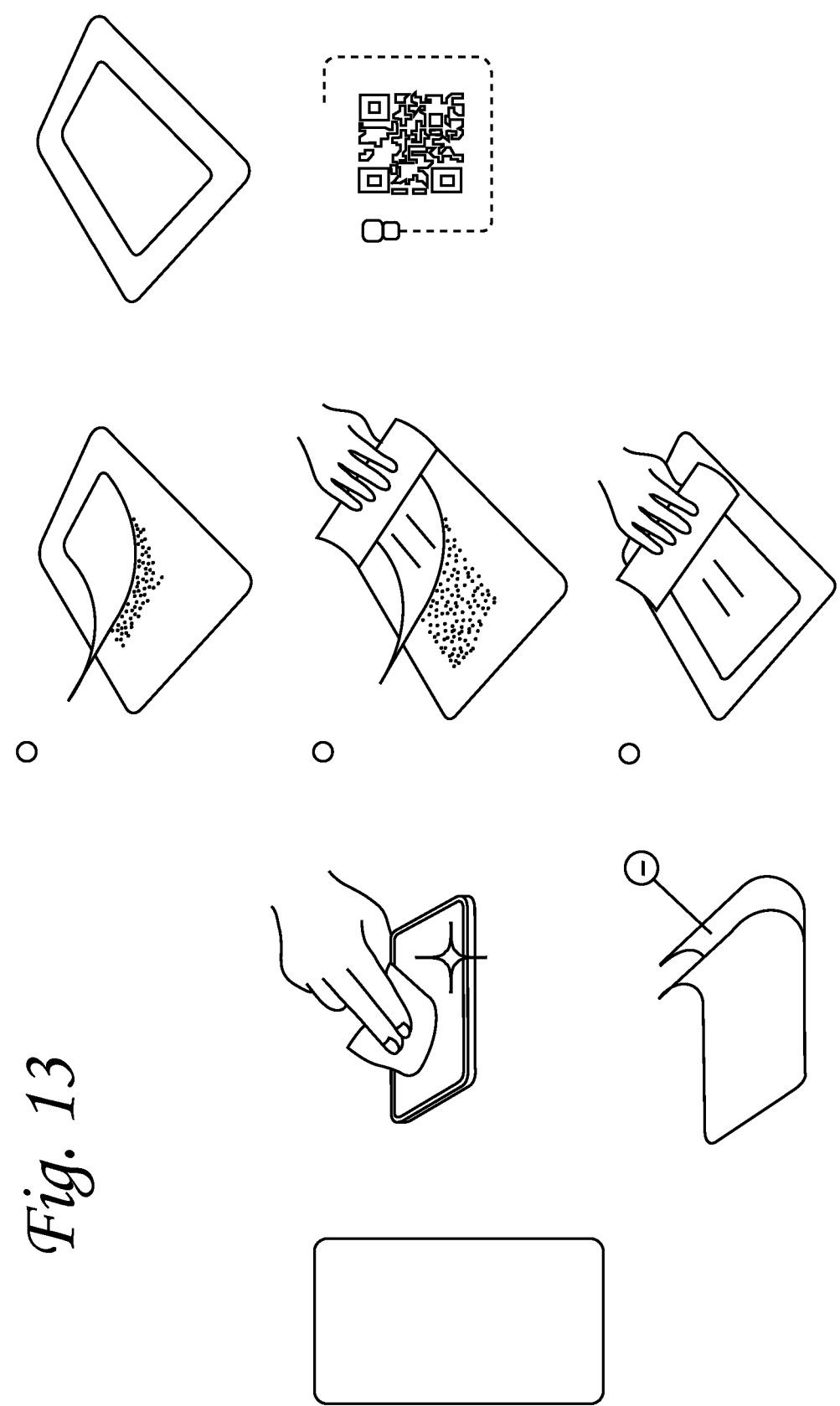
FIG. 13 is a view of an embodiment of instruction that can be included with a kit, such as the kit shown in FIG. 12.
Figure 14:
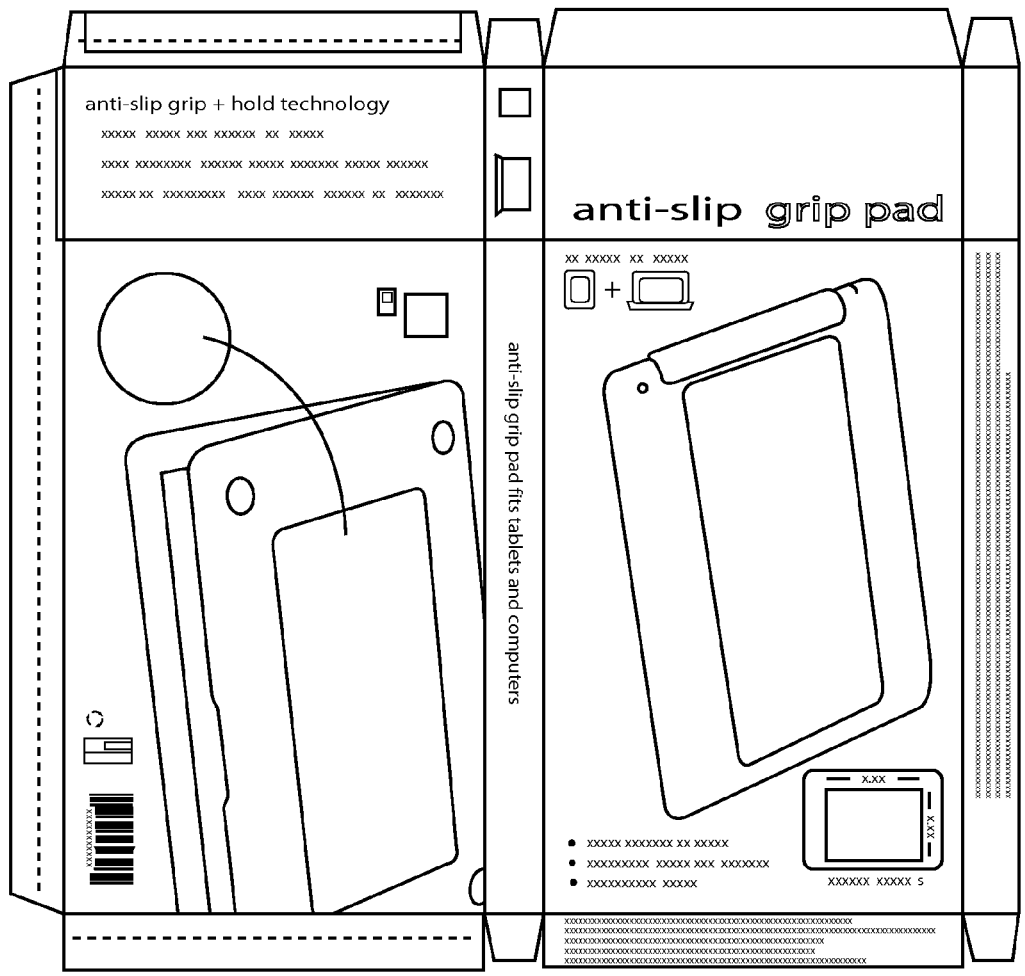
FIG. 14 is a view of an embodiment of packaging that can be used with a kit, such as the kit shown in FIG. 12.

A kit can also be provided that includes various components along with a grip material to enable a user to apply the grip material to an electronic device or electronic device component. In one embodiment shown in FIG. 12, a kit includes one or more grip materials 140, instructions 142 accompanying the grip material that includes text and/or a diagram that can be configured to communicate to a user an electronic device or device component with which the grip material is to be used, and packaging or a carrier for carrying the kit elements 144. The kit can also include a film or other covering that is positioned over the adhesive surface of the grip material, and that is configured to be removed by a user before adhesion of the grip material to a surface. The instructions can vary, but in one embodiment, the instructions include text and/or a diagram instructing a user to remove a covering from the adhesive surface of the grip material if the grip material includes a covering, and instructing the user to apply the adhesive surface of the grip material to a device. The instructions can also be printed instructions included in the packaging with the grip material, or can be online instructions in association with an online point of sale for selling the grip material. In one embodiment, the instructions can be in the form as shown in FIG. 13. In one embodiment, the packaging or carrier can be in the form as shown in FIG. 14.

The claims as originally presented, and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. An apparatus comprising:
    first and second grip materials each having an attachment mechanism, each grip material having a grip surface and a device-attachment surface that is attached to the attachment mechanism of the respective first or second grip material, at least a portion of each grip surface having disposed thereon a plurality of micro-replicated projections each attached to the respective grip material at a projection-attachment end and extending along a projection length to an outer end, each projection having a side surface area along the projection length that is greater than a surface area of the outer end of the projection, each projection configured to flex along its projection length when the respective grip material contacts an external surface to expose at least a portion of the side surface area of the projection to the external surface, the side surface area configured when exposed to provide a grip area that is greater than a grip area provided by the surface area of the outer end of the projection alone when in contact with the external surface, wherein the first grip material removably couples to the second grip material and has a durometer that is different from a durometer of the second grip material; and
    instructions accompanying the grip material and including at least one of text and a diagram that identifies a target electronic device to which the first grip material is to be attached via the attachment mechanism and at least one of text and a second diagram that identifies a surface other than the target electronic device to which the second grip material is to be attached;
    the first grip material being configured to be attached to a surface of the electronic device and to occupy a footprint sized between 5 percent and 100 percent of surface area of the surface of the electronic device.

2. The apparatus of claim 1, wherein the first grip material is formed from different types of materials, each type of material having a different durometer.

3. The apparatus of claim 1, further comprising packaging that depicts the instructions and that holds the first and second grip materials.

4. The apparatus of claim 1, wherein the instructions include printed materials provided with the first and second grip materials.

5. The apparatus of claim 1, wherein the attachment mechanism of the first grip material includes one of a removable case and a removable cover for securely holding the electronic device, the case or cover having a first surface configured to contact the electronic device, and a second surface secured to the device-attachment surface of the grip material.

6. The apparatus of claim 1, wherein the electronic device is one of an e-reader, iPad, smartphone, notebook computer, or laptop computer.

7. The apparatus of claim 1, wherein the attachment mechanism includes an adhesive material accompanying at least one of the first grip material and the second grip material.

8. The apparatus of claim 1, wherein the first grip material is configured to attach to a bottom side of the electronic device.

9. The apparatus of claim 1, wherein the first grip material and the second grip material are configured to work in combination to provide a removable coupling between the first grip material and the second grip material, when the first grip material is attached to the target electronic device and the second grip material is attached to the surface other than the target electronic device.

10. The apparatus of claim 1, wherein the footprint of the first grip material stops short of the edges of the side of the electronic device by at least 5 percent of the width of the surface of the electronic device and 5 percent of the length of the surface of the electronic device.

11. The apparatus of claim 1, wherein at least one of the first grip material and the second grip material is in the shape of an oval.

12. The apparatus of claim 1, wherein at least one of the first grip material and the second grip material is in the shape of a rectangle.

13. An apparatus for providing a slip-prevention grip on a portable electronic device, the apparatus comprising:
    a carrier carrying kit elements, the kit elements including:
        at least two sheets of grip material each with an attachment mechanism, a first sheet of the at least two sheets of grip material having a dimension and configuration to fit on any portable electronic device, wherein the first sheet has a durometer that is different from a durometer of another one of the sheets of grip material, a gripping surface of the first sheet of grip material structured to removably couple with a gripping surface of the another one of the sheets of grip material; wherein each sheet of the at least two sheets of grip material further includes a device-attachment surface that is attached to the attachment mechanism, at least a portion of the gripping surface having disposed thereon a plurality of micro-replicated projections attached to the grip material at a projection-attachment end and extending along a projection length to an outer end, each projection having a side surface area along the projection length that is greater than a surface area of the outer end of the projection, each projection configured to flex along its projection length when the grip material contacts the external surface to expose at least a portion of the side surface area of the projection to the external surface, the side surface area configured when exposed to provide a grip area that is greater than a grip area provided by the surface area of the outer end of the projection alone when in contact with the external surface; and instructions in association with the carrier indicating that at least the first sheet of grip material is usable with portable electronic devices of varied shapes and sizes;

the instructions instructing placing at least a portion of each sheet of the at least two sheets of grip material on surfaces of the portable electronic device, including a bottom surface of a portable electronic device, using a user interface of the portable electronic device, and, concurrent with viewing a display of the portable electronic device and interacting with the user interface, resting the grip material placed on the bottom of the portable electronic device on an external surface.

14. The apparatus of claim 13, wherein the at least two sheets of grip material are removably disposed in the carrier.

15. The apparatus of claim 13, wherein the portable electronic device is one of a tablet device, an e-reader, a gaming device, and a portable telephone.

16. The apparatus of claim 13, wherein the attachment mechanism of at least the first sheet includes one or more straps configured to surround the electronic device.

17. The apparatus of claim 13, wherein the attachment mechanism of at least the first sheet includes an adhesive configured to adhere to the electronic device.

18. The apparatus of claim 13, wherein the attachment mechanism of at least the first sheet includes one or more pieces of hook and loop material configured to attach to a complementary loop and hook material affixed to the electronic device.

19. The apparatus of claim 13, wherein the instructions are removably disposed in the carrier.

20. The apparatus of claim 13, wherein the instructions further state that the at least two sheets of grip material are usable with any portable electronic device.

21. The apparatus of claim 13, wherein at least the first sheet of grip material has a footprint as small as 1 square inch and as large as 10 square inches.

22. A method of assembling a grip product kit, comprising:
providing a carrier configured to hold elements of the grip product kit;
providing at least two sheets of grip material each having an attachment mechanism, each sheet of grip material having a grip surface and a device-attachment surface that is attached to the attachment mechanism, at least a portion of the grip surface including a plurality of micro-replicated projections each attached to the grip material at a projection-attachment end and extending along a projection length to an outer end, each projection having a side surface area along the projection length that is greater than a surface area of an outer end of the projection, each projection configured to flex along its projection length when the grip material contacts an external surface to expose at least a portion of the side surface area of the projection to the external surface, the side surface area configured when exposed to provide a grip area that is greater than a grip area provided by the surface area of the outer end of the projection alone when in contact with the external surface, wherein a first sheet of the at least two sheets of grip material removably couples to another one of the at least two sheets of drip material and has a durometer that is different from a durometer of the other one of the at least two sheets of grip material;
providing instructions for application of at least a portion of each of the at least two sheets of grip material, the instructions including at least one of text and a diagram, the instructions indicating placing the device-attachment surface of the at least a portion of each sheet of the at least two sheets of the grip material on a surface of a portable electronic device via the attachment mechanisms of the respective at least two sheets of grip material; and
placing each sheet of the grip material and the instructions in the carrier.

23. The method of claim 22, wherein the portable electronic device is a tablet device and each sheet of the at least two sheets of grip material is sized and configured to be attached to the tablet device.

24. The method of claim 22, wherein the portable electronic device is an e-reader and each sheet of the at least two sheets of grip material is sized and configured to be attached to the e-reader.

25. The method of claim 22, wherein the portable electronic device is a gaming device and each sheet of the at least sheets of grip material is sized and configured to be attached to the gaming device.

26. The method of claim 22, wherein the portable electronic device is a portable telephone and each sheet of the at least two sheets of grip material is sized and configured to be attached to the portable telephone.

27. The method of claim 22, wherein the surface of the portable electronic device indicated in the instructions includes at least one of a top surface, bottom surface and side surface of the portable electronic device, the bottom surface being opposite the top surface of the portable electronic device, the top surface of the portable electronic device including a display and interface for a human user to interact with the portable electronic device, and wherein one sheet of the at least one sheet of grip material is designated for application to the top surface and has a structure that accommodates the display and interface.

\* \* \* \* \*